United States Patent [19]

Miki et al.

[11] Patent Number: 5,043,587
[45] Date of Patent: Aug. 27, 1991

[54] PHOTOCOUPLER CIRCUIT HAVING DC POWER SOURCE IN SERIES WITH DETECTION AND SWITCHING MEANS

[75] Inventors: Hiroshi Miki; Yasuharu Seki, both of Tokyo, Japan

[73] Assignee: Fuji Electric Co., Ltd., Kawasaki, Japan

[21] Appl. No.: 466,492

[22] Filed: Jan. 17, 1990

[30] Foreign Application Priority Data

Jan. 17, 1989 [JP] Japan .................................. 1-8312

[51] Int. Cl.$^5$ .......................................... G02P 27/00
[52] U.S. Cl. .................................. 250/551; 307/311
[58] Field of Search ............... 250/551, 214 R; 307/311

[56] References Cited

U.S. PATENT DOCUMENTS

| | | | |
|---|---|---|---|
| 3,767,978 | 10/1973 | Wernli | 307/311 |
| 4,021,683 | 5/1977 | Splatt | 307/252 |
| 4,027,228 | 5/1977 | Collins | 307/311 |
| 4,137,428 | 1/1979 | Federico et al. | 179/1 |
| 4,143,187 | 3/1979 | Biggs | 307/311 |
| 4,355,237 | 10/1982 | Harris, Jr. | 250/551 |
| 4,369,371 | 1/1983 | Hara et al. | 250/551 |
| 4,568,838 | 2/1986 | Honda et al. | 307/311 |
| 4,629,901 | 12/1986 | Nishizawa | 250/551 |

FOREIGN PATENT DOCUMENTS

| | | |
|---|---|---|
| 2163495 | 12/1971 | Fed. Rep. of Germany . |
| 2253423 | 10/1972 | Fed. Rep. of Germany . |
| 2344891 | 9/1973 | Fed. Rep. of Germany . |
| 2930176 | 7/1979 | Fed. Rep. of Germany . |

*Primary Examiner*—David C. Nelms
*Assistant Examiner*—Que T. Le
*Attorney, Agent, or Firm*—Brumbaugh, Graves, Donohue & Raymond

[57] ABSTRACT

Provided is an enhanced switching speed photo-coupler circuit for providing an output signal in response to an isolated input signal. The photocoupler is comprised of a phototransistor which operates in the active region in response to an applied input signal. A switching transistor connected to the output of the phototransistor is turned on when the phototransistor enters the active region. An output signal, measured from the collector of the switching transistor, will change only slightly in comparison with the off state. In one embodiment, a power semiconductor is coupled to the circuit output for enhanced switching speed.

13 Claims, 5 Drawing Sheets

PHOTOCOUPLER CIRCUIT HAVING DC POWER SOURCE IN SERIES WITH DETECTION AND SWITCHING MEANS

BACKGROUND OF THE INVENTION

The present invention relates to a photocoupler for transmitting, at high speed, a signal insulated, or isolated, by the photocoupler and particularly to a photocoupler circuit for driving a power semiconductor element at high speed.

For power conversion with ON-OFF operation of a semiconductor element, the ON-OFF signal to be applied to such semiconductor element is insulated and transmitted by a photocoupler. The power conversion, due to pulse width modulation control, is required to form a photocoupler circuit to satisfy the requirement that such ON-OFF signal must be transmitted at a high speed.

FIG. 12 is a schematic diagram showing a prior art circuit for transmitting a signal using a photocoupler.

In the circuit of FIG. 12, a pair of general purpose photocouplers 2 are used to insulate and transmit the ON-OFF signal to a power transistor 20. General purpose photocouplers use phototransistors to receive the light; these phototransistors have a long transition time from the ON state to the OFF state A long transition time from ON to OFF of such phototransistor is considerably long because a reasonably long time is required to eliminate excessive carrier accumulated in this phototransistor.

FIG. 13 is a schematic diagram showing a second prior art circuit for transmitting a signal using a photocoupler.

In the second prior art circuit of FIG. 13, a high speed photocoupler 2A is used for insulating and transmitting a signal; the pair of general purpose photocouplers used in the first prior art of FIG. 12 is now reduced to a single high speed unit.

As is apparent from the first and second prior art circuits described above, these prior art circuits have disadvantages. First, the circuit using general purpose photocouplers is complicated, and the number of parts increases since a pair of photocouplers (for start and stop) must be used to realize high speed signal transmission. Second, a comparatively large drive current is necessary to make the photocouplers conductive.

Moreover, if a high speed photocoupler is used, other disadvantages occur. A high speed photocoupler is expensive; it is large in comparison with a general purpose photocoupler; and it requires a comparatively large drive current to become conductive.

It is therefore an object of the present invention to realize high speed signal transmission by reducing the number of general purpose and low speed photocouplers while using them and also reduce the required drive current.

SUMMARY OF THE INVENTION

In order to achieve the object of the present invention described above, the present invention discloses an enhanced switching speed photocoupler circuit, for providing an output signal in response to an isolated input signal, comprising photocoupler means, having a phototransistor, for providing isolation of an input signal; a switching transistor, coupled to said phototransistor, for providing a signal representative of a desired output signal; and biasing means, having a source of DC power coupled to a series combination of said phototransistor and said switching transistor, for enabling said switching transistor to switch between ON and OFF states with a voltage drop across said switching transistor in its ON state which is small relative to the voltage or said DC source; whereby, the limited change in voltage across said phototransistor during ON and OFF states of said switching transistor causes the phototransistor to operate in its active region, with reduced drive current and avoiding saturation, thereby reducing the phototransistor transition time from ON to OFF and enhancing overall switching speed.

The present invention has a connecting point to the base-emitter junction of a switching transistor connected in series to the collector and emitter terminal of the phototransistor of the photocoupler, and a voltage is applied to this circuit. Thereby, even when said phototransistor is in the ON state, excessive carrier is not accumulated by operating such phototransistor in the active region and the transition time from ON to OFF state can also be curtailed. Moreover, a collector to emitter voltage of the phototransistor is almost equal to the power supply voltage to be applied, whether the photocoupler is in the ON or OFF state. Therefore, the phototransistor operates as a current output type switch and can reduce a drive current thereof.

For a better understanding of the present invention, together with other and further objects, reference is made to the following description, taken in conjunction with the accompanying drawings, and its scope will be pointed out in the appended claims.

DESCRIPTION OF THE PREFERRED EMBODIMENT

Figure 1:
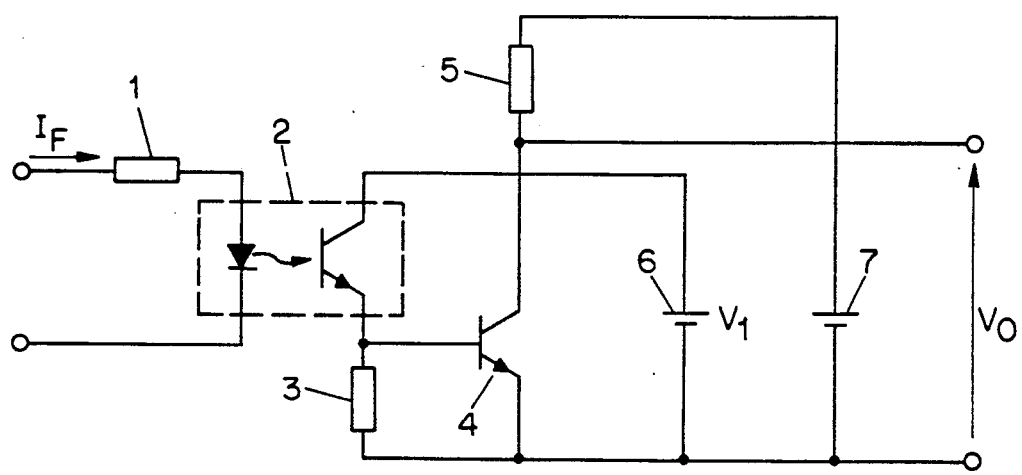
FIG. 1 is a circuit diagram of a first embodiment of the present invention.

FIG. 1 depicts an enhanced switching speed photocoupler circuit in accordance with the present invention.

In FIG. 1, an input resistance is provided on the input side of a general purpose or low speed photocoupler 2 (hereinafter referred only to as photocoupler) and a value of drive current $I_F$ of photocoupler 2 is determined from a voltage applied to the input terminal and a resistance value of an input resistance 1.

When drive current $I_F$ flows into the photocoupler 2, the phototransistor provided on the output side of photocoupler 2 switches ON but this phototransistor is connected in series with the switching transistor 4 between the base and emitter thereof utilizing the NPN transistor and is further connected with a biasing means shown as a first DC power supply 6. When a voltage of this first DC power supply 6 is $V_1$, a voltage across the base and emitter of switching transistor 4 is $V_{BE}$, a voltage $V_{CE}$ across collector and emitter of phototransistor is expressed by:

$$V_{CE} = V_1 - V_{BE} \quad (1)$$

where $V_{BE} = 0.6$ to $0.7$ volts, and $V_1 = 3$ to $5$ volts.

Therefore, the phototransistor is used in the active region. Accordingly, the switching speed of photocoupler 2 can be improved remarkably.

Figure 2:
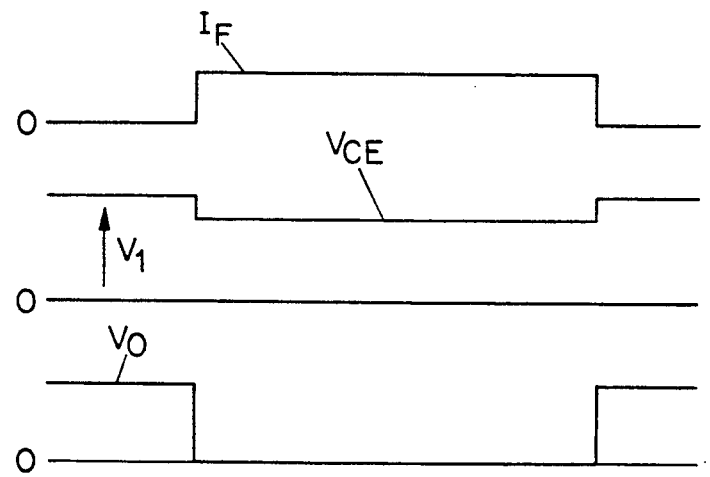
FIG. 2 is a timechart of operations of the first embodiment circuit shown in FIG. 1.

FIG. 2 is a timechart of operations of the first embodiment shown in FIG. 1. The top line indicates changes of a current $I_F$ for driving the photocoupler 2; The middle line includes changes of an output voltage $V_{CE}$ of the photocoupler 2, and The bottom line includes changes of an output voltage $V_O$ of the photocoupler circuit.

As is obvious from FIG. 1 and FIG. 2, when the photocoupler drive current $I_F$ rises, a current, which is determined by the characteristic of the phototransistor, flows after a small time delay in the phototransistor through the path of the first DC power supply 6, the collector of the phototransistor, the base of switching transistor 4, and back to the first DC power supply 6. As a result, the switching transistor 4 becomes conductive and an output voltage $V_O$ of the circuit switches to a low level.

When the photocoupler drive current $I_F$ falls to a low level, the carrier accumulated in the switching transistor 4 is exhausted through a resistor 3, the switching transistor 4 turns OFF and the output voltage $V_O$ of the circuit switches to a high level (equal to the voltage of a second DC power supply 7). The resistor 3 may be removed if the carrier discharge time of the switching transistor 4 is a very short period.

Figure 3:
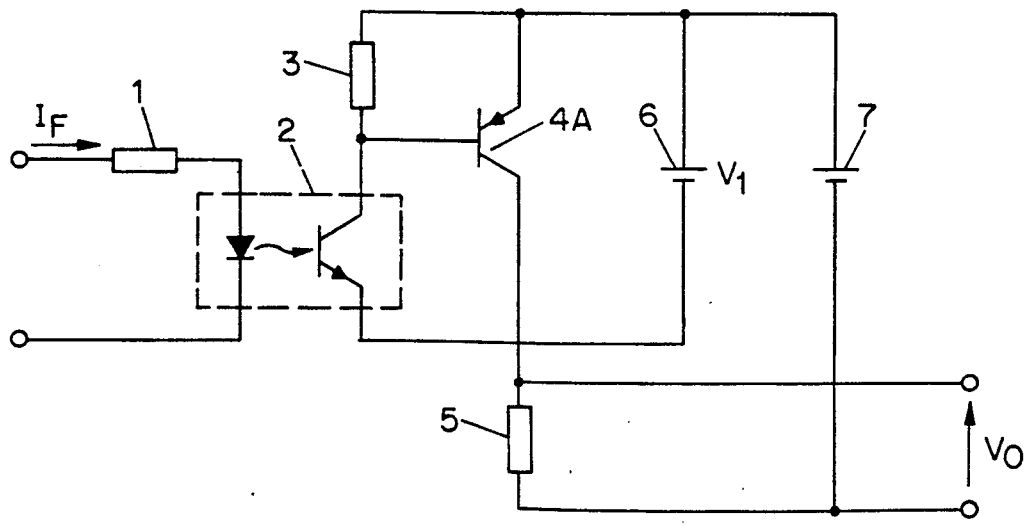
FIG. 3 is a circuit diagram indicating a second embodiment of the present invention.

FIG. 3 is a circuit of the second embodiment of the present invention. In this figure, the switching transistor 4A is a PNP transistor and the junction of the input resistor 1, photocoupler 2 and resistors 3 and 5, first DC power supply 6 and second DC power supply 7 is the same as that of the first embodiment described above. Due to the use of a PNP transistor for the switching transistor 4A, the convection to the photocoupler 2 is different than in the embodiment shown in FIG. 1.

Figure 4:
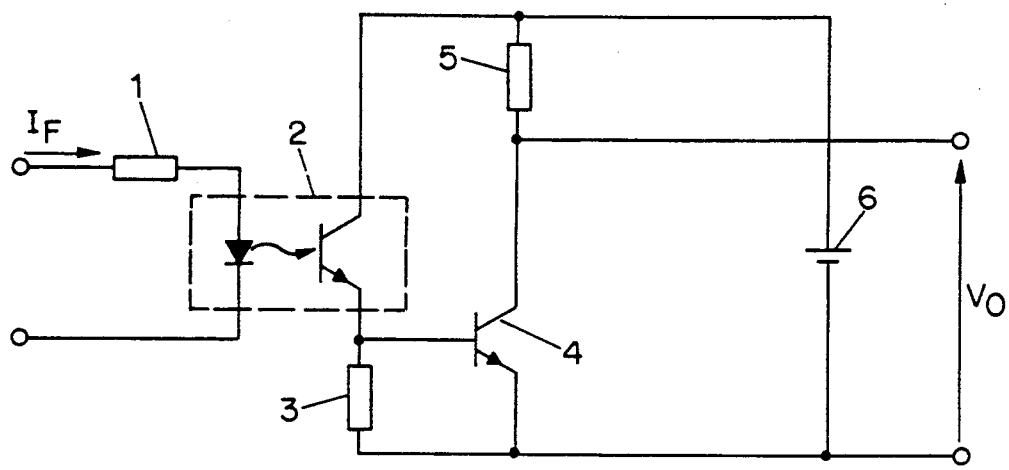
FIG. 4 is a circuit diagram indicating a third embodiment of the present invention.

FIG. 4 is a circuit of the third embodiment of the present invention which has the same structure as the first embodiment shown in FIG. 1, except that the first DC power supply 6 is used in common for the power supply of both the photocoupler 2 and the switching transistor 4; thereby the second DC power supply 7 is not necessary.

Figure 5:
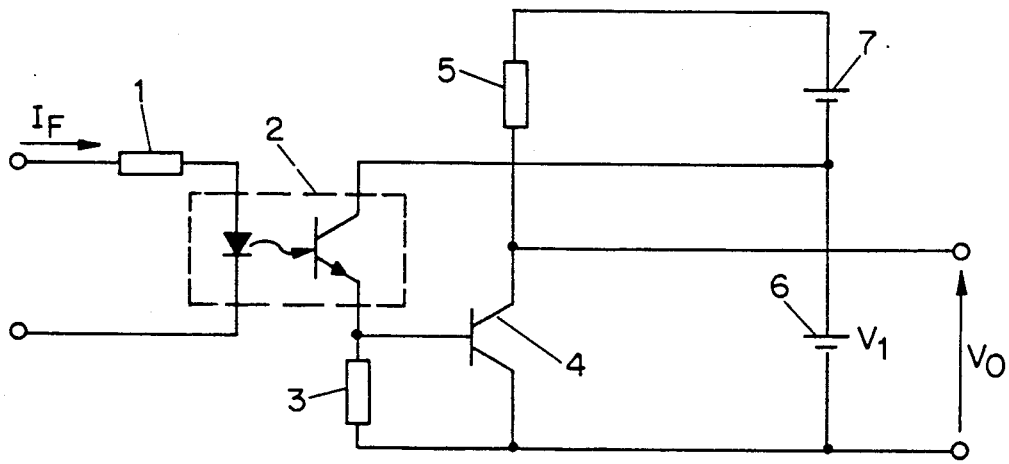
FIG. 5 is a circuit diagram indicating a fourth embodiment of the present invention.

FIG. 5 is a circuit diagram of the fourth embodiment of the present invention which has the same structure as the first embodiment shown in FIG. 1, except that the first DC power supply 6 is provided for the photocoupler 2, while a series connected circuit of the first DC power supply 6 and the second DC power supply 7 is provided for the switching transistor 4.

Figure 6:
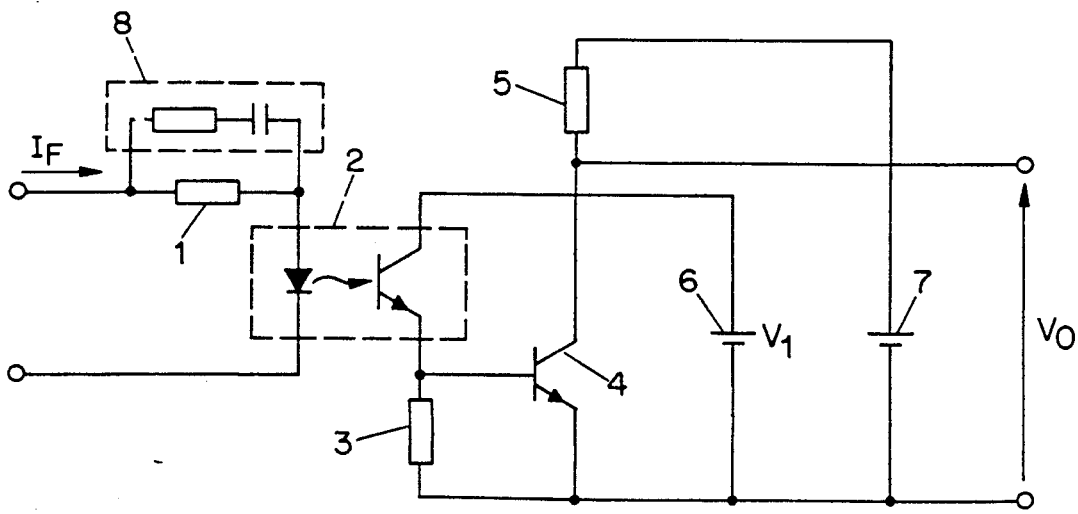
FIG. 6 is a circuit diagram indicating a first application example of the present invention.

FIG. 6 is a circuit diagram indicating a first application example of the present invention, wherein the circuit following the photocoupler 2 is the same as the first embodiment circuit shown in FIG. 1 but the signal input circuit to the photocoupler 2 is different. Specifically, the input resistor 1 provided in the input side of photocoupler 2 is connected with a differential circuit 8 formed by a resistor and a capacitor to emphasize change of a photocoupler drive current $I_F$. Therefore, the signal transmission period for turning ON the photocoupler 2 can be shortened.

Figure 7:
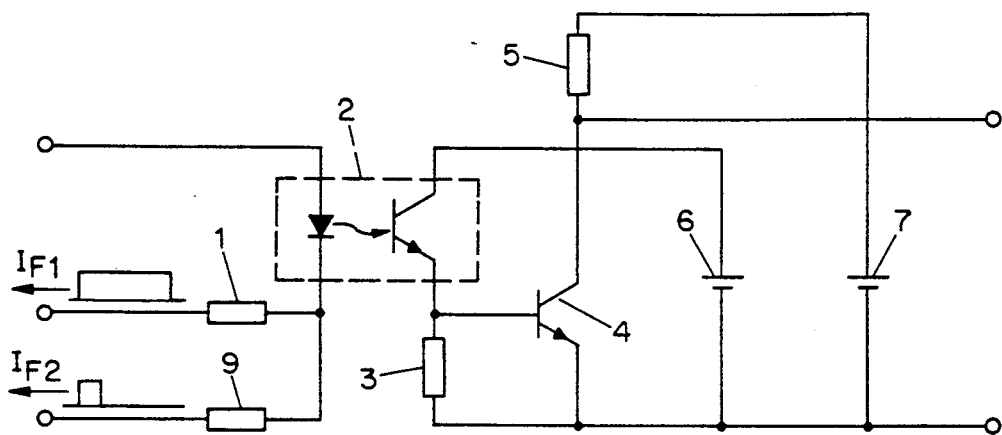
FIG. 7 is a circuit diagram indicating a second application example of the present invention.

FIG. 7 is a circuit diagram indicating a second application example of the present invention to shorten the signal transmission period for turning ON the photocoupler. Specifically, a drive current $I_{F2}$ flowing into the input resistor 9, is superimposed on the drive current $I_{F1}$ flowing into the input resistor 1 provided in the input side of the photocoupler 2.

Figure 8:
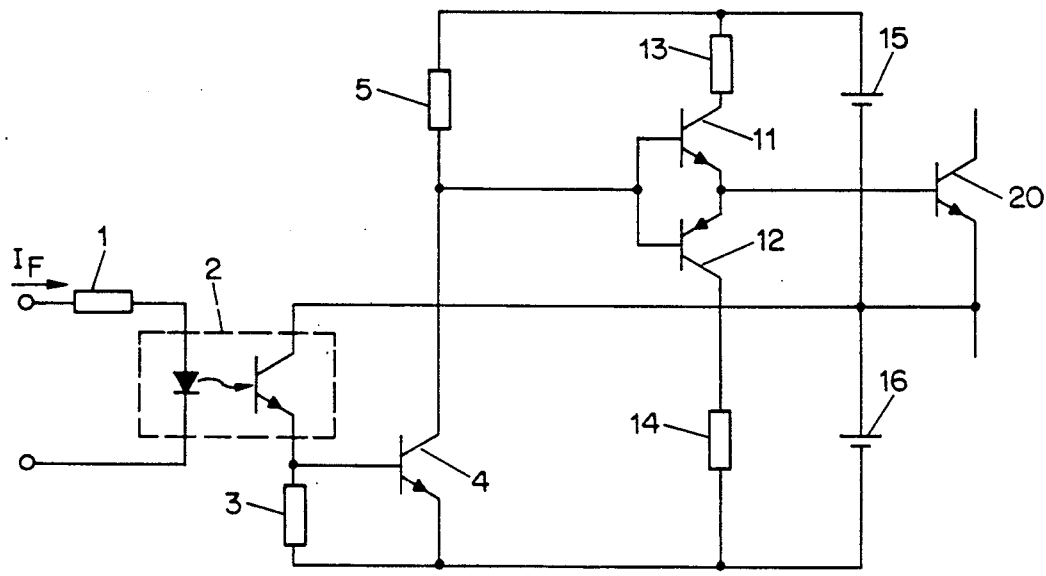
FIG. 8 is a circuit diagram indicating a fifth embodiment of the present invention for driving a power semiconductor element.

FIG. 8 is a circuit diagram indicating a fifth embodiment of the present invention to drive a power semiconductor element. The circuit of FIG. 8 insulates its input operating signal with the photocoupler 2 and transmits it at high speed in order to turn ON and OFF the power transistor 20. For this purpose, the connecting point of the gate and emitter of the switching transistor 4 is connected in series to the phototransistor of photocoupler 2 and the backward bias power supply 16 of the power transistor 20 is connected to such series circuit. Moreover, a series circuit of the backward bias power supply 16 and forward bias power supply 15 is connected between the collector and emitter of the switching transistor 4 and operation of this switching transistor 4 is applied to the gates of forward bias transistor 11 and backward bias transistor 12.

With such a circuit structure, since excessive carrier is not accumulated in the phototransistor, a time delay of signal transmission when the a drive current $I_F$ input to the photocoupler 2 becomes zero can be shortened to a very short period and thereby the performance of power conversion unit utilizing the power transistor 20 can be greatly improved.

Moreover, a current transmission ratio of photocoupler 2 becomes very large because the switching transistor 4 can be driven with a small amount of current and the photocoupler is operated in the active region. Namely, a value of the drive current $I_F$ of photocoupler 2 can be reduced in comparison with the values in prior art.

Figure 9:
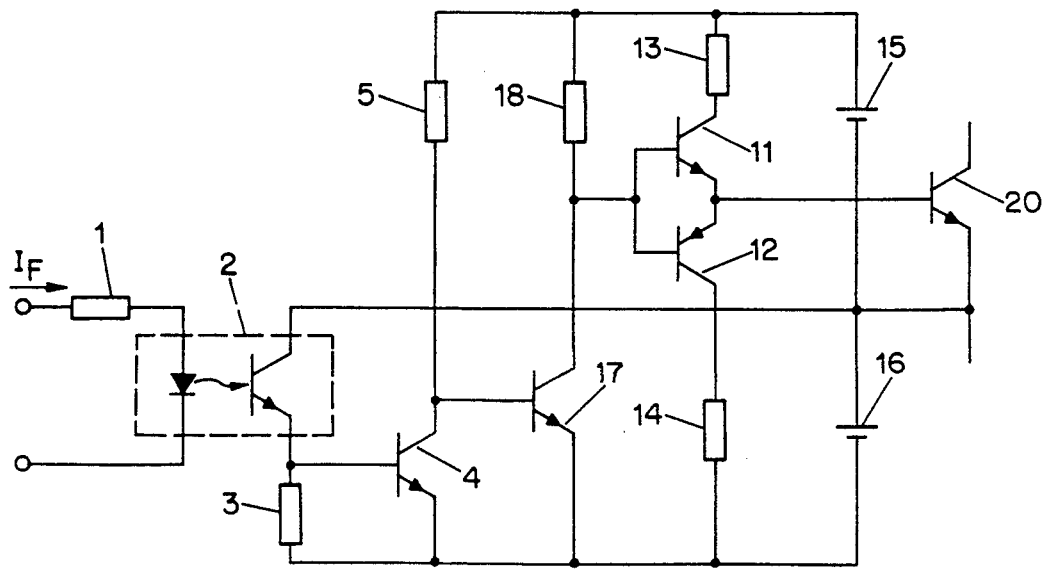
FIG. 9 is a circuit diagram indicating a sixth embodiment of the present invention for driving a power semiconductor element.

FIG. 9 is a circuit diagram indicating a sixth embodiment of the present invention for driving the power semiconductor element which is the same as the fifth embodiment described with reference to FIG. 8, except that an amplifying transistor 17 is provided in the next stage of the switching transistor 4 to operate the forward bias transistor 11 and the backward bias transistor 12 with the amplifying transistor 17.

Figure 10:
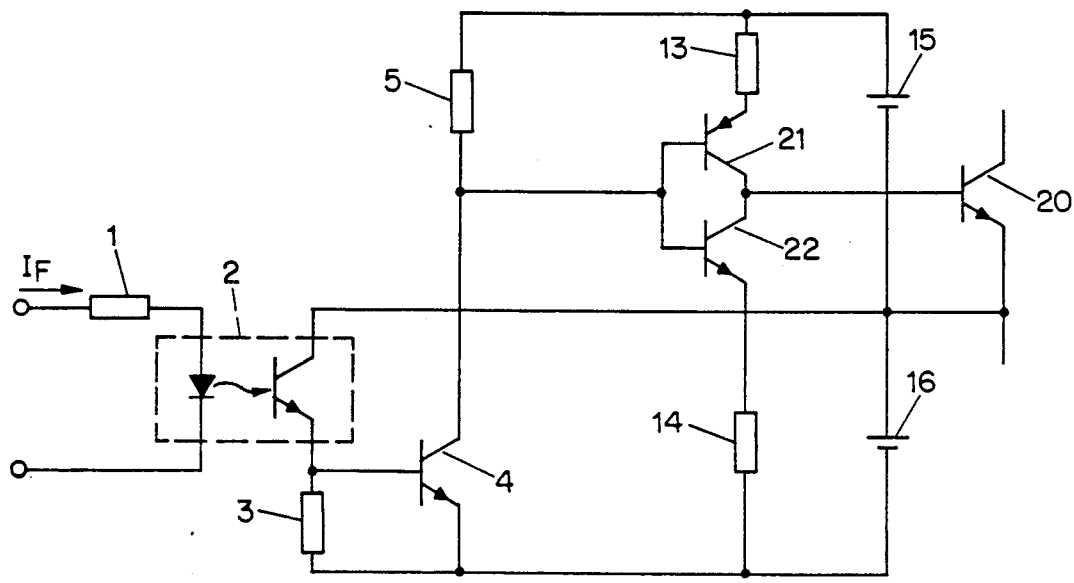
FIG. 10 is a circuit diagram indicating a seventh embodiment of the present invention for driving a power semiconductor element.

FIG. 10 is a circuit diagram indicating a seventh embodiment of the present invention for driving a power semiconductor element which is the same as the circuit diagram of fifth embodiment of FIG. 8, except that a PNP transistor is used for forward bias transistor 21 in this seventh embodiment and an NPN transistor is used for backward bias transistor 22.

Figure 11:
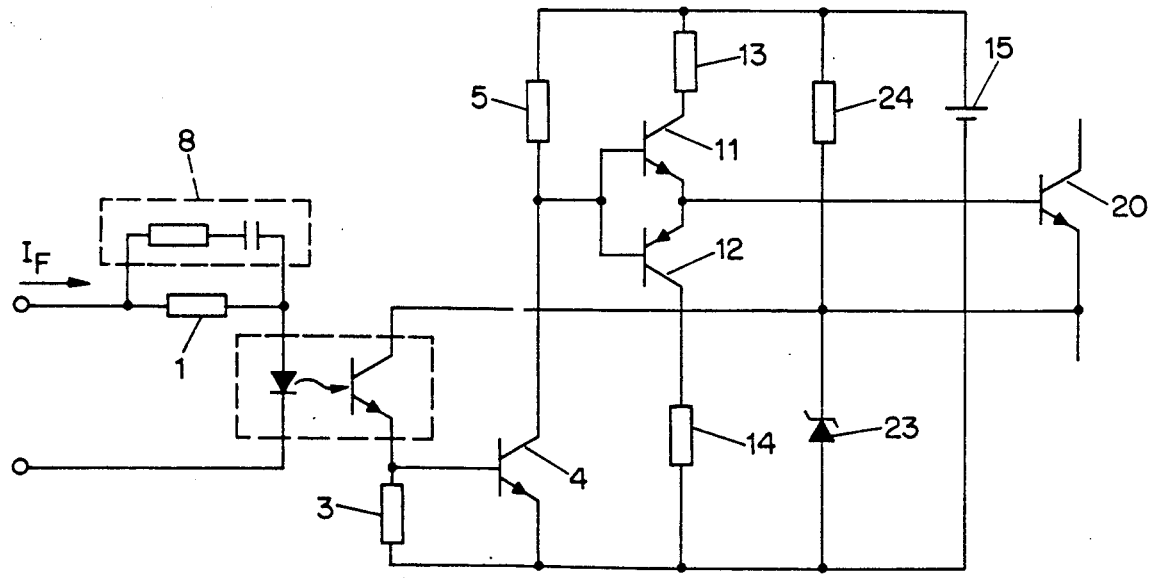
FIG. 11 is a circuit diagram indicating an eighth embodiment of the present invention for driving a power semiconductor element.
Figure 12:
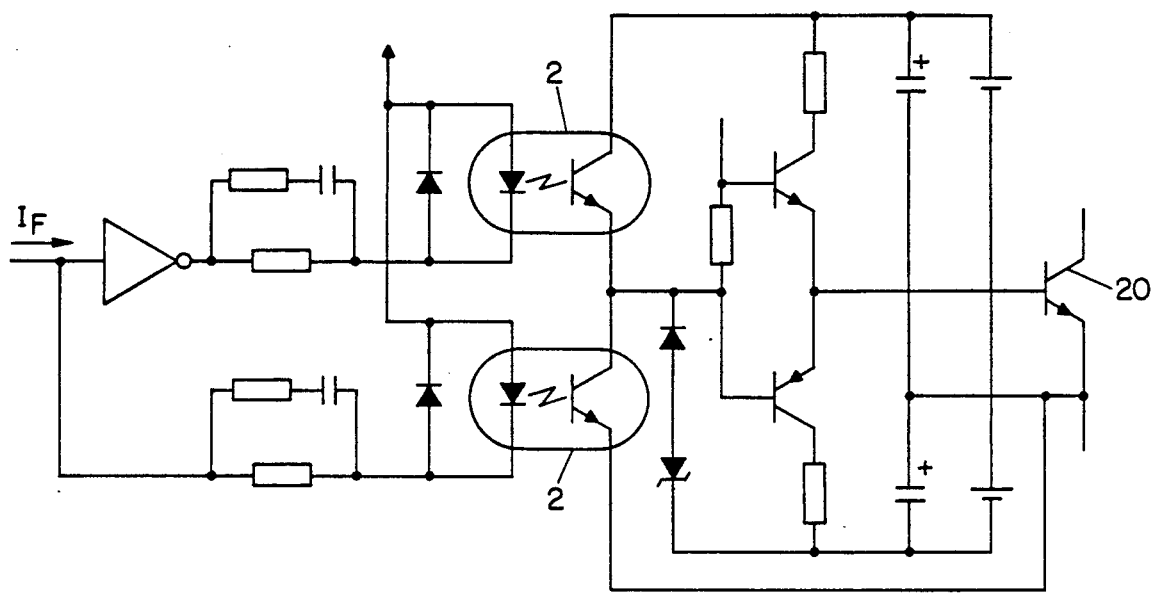
FIG. 12 is a circuit diagram indicating a first prior art of a photocoupler circuit for transmitting a signal with a photocoupler.
Figure 13:
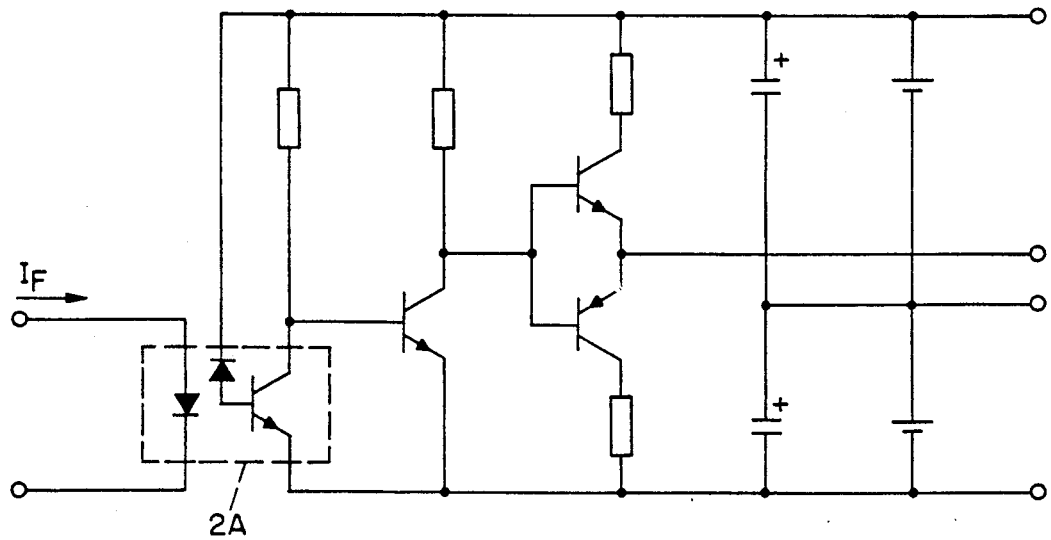
FIG. 13 is a circuit diagram indicating a second prior art of a photocoupler circuit for transmitting a signal using a photocoupler.

FIG. 11 is a circuit diagram indicating an eighth embodiment of the present invention for driving a power semiconductor element. In FIG. 11, a series circuit of the resistor 24 and a constant voltage diode 23 is connected to the forward bias power supply 15 in order to cause the constant voltage diode 23 to provide the function as the backward bias power supply. Thereby, one DC power supply can be omitted.

Moreover, the signal input circuit to the photocoupler 2 is different from that of the fifth embodiment circuit shown in FIG. 8. Namely, since a differential circuit 8 structured by a resistor and a capacitor is connected in parallel with the input resistor 1 provided in the input side of the photocoupler 2 to emphasize change of the photocoupler drive current $I_F$, the signal transmission time for turning ON the photocoupler 2 can be shortened.

It is obvious that the system of using both resistors 1 and 5 to increase a photocoupler drive current shown in FIG. 7, or the system of using a differential circuit 8 shown in FIG. 6 and FIG. 11 and a system for using a constant voltage diode 23 shown in FIG. 11 as the DC power supply can be applied to the other embodiment circuit or application circuit not employing such systems.

According to the present invention, since the photocoupler circuit is so structured that the phototransistor of photocoupler, the circuit across the base and emitter of the switching transistor and the first DC power supply are connected in series, the photocoupler is used and the current output switch operating in the active region and an output signal is extracted from the collector of switching transistor, if a general purpose photocoupler which shows transmission delay in the OFF signal is particularly used, the signal can be transmitted at a high speed and it is no longer necessary to use a large size and expensive high speed photocoupler. Therefore, a general purpose photocoupler may be applied to a power conversion unit which is particularly required to provide the high speed operation, resulting in the effect that the unit may be reduced in size and can be formed at a low cost. In addition, the photocoupler may be used as a current output switch with reduced a photocoupler drive current because a current transmission ratio is large. In this aspect the photocoupler circuit of the present invention provides much contribution to realization of small size and low cost.

While there have been described what are believed to be the preferred embodiments of the invention, those skilled in the art will recognize that other and further modifications may be made thereto without departing from the invention and it is intended to claim all such changes and modifications as fall within the scope of the invention.

WE CLAIM:

1. An enhanced switching speed photocoupler circuit, for providing an output signal in response to an isolated input signal, comprising:
   photocoupler means, having a phototransistor, for providing isolation of an input signal;
   a switching transistor, coupled to said phototransistor, for providing a signal representative of a desired output signal; and
   biasing means, having a source of DC power coupled to a series combination of said phototransistor and said switching transistor, for enabling said switching transistor to switch between ON and OFF states with a voltage drop across said switching transistor in its ON state which is small relative to the voltage of said DC source;
   whereby, the limited change in collector-emitter voltage across said phototransistor between ON and OFF states of said switching transistor, causes the phototransistor to operate in its active region, with reduced drive current and avoiding saturation, thereby reducing the phototransistor transition time from ON to OFF and enhancing overall switching speed.

2. The photocoupler circuit of claim 1 in which the switching transistor is an NPN type transistor.

3. The photocoupler circuit of claim 1 in which the switching transistor is a PNP type transistor.

4. The photocoupler circuit of claim 1 in further comprising means for providing two input signals superimposed upon each other.

5. An enhanced switching speed photocoupler circuit, for driving a power semiconductor element in response to an isolated input signal, comprising:
   photocoupler means, having a phototransistor, for providing isolation of an input signal;
   a switching transistor, coupled to said phototransistor, for providing a signal representative of a desired output signal;
   biasing means, having a source of DC power coupled to a series combination of said phototransistor and said switching transistor, for enabling said switching transistor to switch between ON and OFF states with a voltage drop across said switching transistor in its ON state which is small relative to the voltage of said DC source; and
   a power semiconductor element coupled to the collector of said switching transistor;
   whereby, the limited change in collector-emitter voltage across said phototransistor, between ON and OFF states of said switching transistor, causes the phototransistor to operate in its active region, with reduced drive current and avoiding saturation, thereby reducing the phototransistor transition time from ON to OFF and enhancing overall switching speed.

6. The photocoupler circuit of claim 5 further comprising a forward bias transistor and a backward bias transistor connected in parallel between the collector of said switching transistor and the base of said power semiconductor element.

7. The photocoupler circuit of claim 6 further comprising an amplifying transistor connected between the collector of said switching transistor and the base leads of said backward bias transistor and said forward bias transistor.

8. The photocoupler circuit of claim 6 in which said forward bias transistor is a PNP type transistor and said backward bias transistor is an NPN type transistor.

9. The photocoupler circuit of claim 6 in which said forward bias transistor is an NPN type transistor and said backward bias transistor is a PNP type transistor.

10. The photocoupler circuit of claim 5 further comprising a resistor and a zener diode coupled to said power semiconductor element.

11. The photocoupler circuit of claim 6 further comprising a resistor and a constant voltage diode connected in series across the collectors of said forward bias transistor and said backward bias transistor.

12. The photocoupler circuit of claim 6 further comprising signal differentiating means, coupled to the input of said photocoupler, for differentiating said input signal whereby the phototransistor transition time is further reduced.

13. The photocoupler circuit of claim 6 further comprising differentiating means, coupled to the input of said photocoupler, for differentiating said input signal, said differentiating means comprising a resistor and a compactor connected in series.

* * * * *

UNITED STATES PATENT AND TRADEMARK OFFICE
CERTIFICATE OF CORRECTION

PATENT NO. : 5,043,587

DATED : August 27, 1991

INVENTOR(S) : Miki et al

It is certified that error appears in the above-identified patent and that said Letters Patent is hereby corrected as shown below:

Title page, item 56, 7th line, "4,143,187" should read --4,143,287--.

Signed and Sealed this

Sixteenth Day of March, 1993

Attest:

STEPHEN G. KUNIN

Attesting Officer

Acting Commissioner of Patents and Trademarks